United States Patent [19]
Heeger et al.

[11] Patent Number: 5,869,350
[45] Date of Patent: Feb. 9, 1999

[54] FABRICATION OF VISIBLE LIGHT EMITTING DIODES SOLUBLE SEMICONDUCTING POLYMERS

[75] Inventors: Alan J. Heeger, Santa Barbara; David Braun, Goleta, both of Calif.

[73] Assignee: The Regents of the University of California, Oakland, Calif.

[21] Appl. No.: 359,883

[22] Filed: Dec. 20, 1994

Related U.S. Application Data

[62] Division of Ser. No. 662,290, Feb. 27, 1991, Pat. No. 5,408,109.

[51] Int. Cl.$^6$ .................................................. H01L 51/40
[52] U.S. Cl. ............................................... 438/29; 438/99
[58] Field of Search ............................ 437/905; 257/40; 438/22, 99, 29

[56] References Cited

U.S. PATENT DOCUMENTS

| | | |
|---|---|---|
| 3,172,862 | 3/1965 | Gurnee et al. |
| 3,263,110 | 7/1966 | Berg . |
| 4,611,385 | 9/1986 | Forrest et al. |
| 4,684,353 | 8/1987 | deSouza . |
| 4,720,432 | 1/1988 | VanSlyke et al. |
| 4,885,211 | 12/1989 | Tang et al. |
| 5,009,958 | 4/1991 | Yamashita et al. |
| 5,093,691 | 3/1992 | Utsugi et al. |
| 5,142,343 | 8/1992 | Hosokawa et al. |
| 5,171,373 | 12/1992 | Hebard et al. |
| 5,185,208 | 2/1993 | Yamashita et al. |
| 5,247,190 | 9/1993 | Friend et al. |
| 5,317,169 | 5/1994 | Nakano et al. |
| 5,331,183 | 7/1994 | Sariciftci et al. |
| 5,334,539 | 8/1994 | Shinar et al. |

FOREIGN PATENT DOCUMENTS

| | | |
|---|---|---|
| 2037917 | 2/1991 | Canada . |
| 443861 | 8/1991 | European Pat. Off. . |
| 0423283 B1 | 1/1995 | European Pat. Off. . |
| 59-181681 | 10/1984 | Japan . |
| 60-149177 | 8/1985 | Japan . |
| 61-226974 | 10/1986 | Japan . |
| 63-133682 | 6/1988 | Japan . |
| WO90/13148 | 11/1990 | WIPO . |

OTHER PUBLICATIONS

Braun, D., et al, "Transient Electroluminescence From Polymer Light Emitting Diodes", Int'l Conf. on Synth. Metals Goteborg Sweden Aug. 1992.
Burn, P., et al, "Chemical Tuning...Allow Patterning", Nature, vol. 356, Mar. 5, 1992, pp. 47–49.
Braun, D., et al, "Visible Light...Polymer Diodes", Appl. Phys. Lett. 58(18) May 1991, pp. 1983–1984.
Gustafsson, G., et al, "Flexible light–emitting...Polymers", Nature, vol. 357, Jun. 11, 1992.
Rughoopath, S. D. D. V., et al "Soluble Conducting Polymers" The poly (3–alkylthienylenes), Synthetic Metals (Aug. 1987) vol. 21, No. 1, pp. 41–50 (Abstract only).
Jenekhe, S., et al "Complexation Mediated...Solvents", Macromolecules 1990, vol. 23, No. 20, pp. 4419–4429.
Sze, M.S. *Physics of Semiconductor Laser Devices*, (1981) Wiley–Interscience, New York, Chapter 13, "Photodetectors" pp. 743–789.
Sze, M.S. *Physics of Semiconductor Laser Devices*, (1981) Wiley–Interscience, New York, Chapter 14, "Solar Cells" pp. 790–838.
Fox, M.A., et al., Editors, *Photoinduced Electron Transfer*, (1988) Elsevier Science Publishers, Amsterdam, table of contents for Part A, "Conceptual Basis".
Fox, M.A., et al., Editors, *Photoinduced Electron Transfer*, (1988) Elsevier Science Publishers, Amsterdam, Part D, "Photoinduced Electron Transfer Reactions: Inorganic Substrates and Applications" table of contents for part D.
Karmat, P., "Photoinduced charge transfer between fullerenes (C60 and C70) and semiconductor ZnO colloids" *J. Am, Chem. Soc.*(1991) 113:9705–9707.
Wang, Y., "Photoconductivity of fullerene–doped polymers" *Nature*(1992) 356:585–587.
Arbogast, J., et al., "Photophysical properties of C60" *J. Phys. Chem.*(1991) 95:11–12.
Koezuka et al., "Organic Heterojunctions utilizing two conducting polymers: Poly(acetylene)/poly(N–methylpyrrole) junctions" *J. Appl. Phys.*(1985) 58:1279–1284.
Paasche et al., "Amorphous–SIC thin–film p–i–n light–emitting diode using amorphous–SIN hot–carrier tunneling injection lavers" *IEE Transactions on Electron Devices* (1989) 36:2895–290.
Vincett et al., "Electrical conduction and low voltage blue electroluminescence in vacuum–deposited organic films" *Thin Solid Films* (1982) 94:171–183.
Tang et al., "Organic electroluminescent diodes"*Appl. Phys. Lett.* (1987) 51:913–915.
Tang et al., "Electroluminescence of doped organic thin films" *J. Appl. Phys.* (1989) 65:3610–3616.
Adachi et al., "Organic electroluminescent device having a hole conductor as an emitting layer"*Appl. Phys. Lett.* (1989) 55:1489–1491.
Adachi et al., "Blue light–emitting organic electroluminescent devices"*Appl. Phys. Lett.* (1990)56:799–801.
Nohara et al., "A new series of electroluminescent organic compounds" *Chemistry Letters* (1990) pp. 189–190.
Burroughes et al., "Light–emitting diodes based on conjugated polymers" *Nature* (1990) 347:539–541.
Tomozawa et al., "Metal–polymer Schottky barriers on processible polymers" *Synthetic Metals* (1989) 28:C687–C690.

(List continued on next page.)

*Primary Examiner*—George R. Fourson
*Attorney, Agent, or Firm*—Morrison & Foerster LLP

[57] ABSTRACT

Visible light LEDs are produced having a layer of conjugated polymer which is cast directly from solution or formed as a gel-processed admixture with a carrier polymer. The LEDs can be formed so as to emit polarized light.

73 Claims, No Drawings

OTHER PUBLICATIONS

Wudl et al., "Polymers and an unusual molecular crystal with nonlinear optical properties" *Materials for Nonlinear Optics: Chemical Perspectives* (1991) Chapter 46, pp. 683–686.

Sze, *Physics of semiconductor devices* (1981) 2nd ed., John Wiley & Son, Inc. New York, New York, p. 251.

Hagler et al., "Highly ordered conjugated polymers in polyethylene: Orientation by mesoepitaxy" *Polymer Comm.* (1991) 32:339–342.

Hagler et al., "Enhanced order and electronic delocalization in conjugated polymers oriented by gel processing in polyethylene" *Phys. Rev. B* (1991) 44:8652–8666.

FABRICATION OF VISIBLE LIGHT EMITTING DIODES SOLUBLE SEMICONDUCTING POLYMERS

RELATED APPLICATIONS

This application is a divisional application of U.S. Ser. No. 07/622,290, filed 27 Feb., 1991, now issued U.S. Pat. No. 5,408,109.

REFERENCE TO GOVERNMENT SUPPORT

The Government has rights in this invention pursuant to Contract No. NO0014-83-K-0450 awarded by the Office of Naval Research.

FIELD OF THE INVENTION

This invention relates generally to light-emitting diodes and their fabrication. More particularly, it concerns light-emitting diodes fabricated from semiconducting (conjugated) polymers which are soluble in common organic solvents, and yet more particularly to the fabrication of such diodes on flexible polymer substrates.

BACKGROUND OF THE INVENTION

Solid-state light-emitting diodes (LEDs) have found widespread application in displays, as well as in a variety of less common applications. Currently, LEDs are fabricated from conventional semiconductors; for example, gallium arsenide (GaAs), typically doped with aluminum, indium, or phosphorus. Using this technology, it is very difficult to make large area displays. In addition, the LEDs made of these materials are typically limited to the emission of light at the long wavelength end of the visible spectrum. For these reasons, there has been considerable interest for many years in the development of suitable organic materials for use as the active (light-emitting) components of LEDs. (See references 1–6). The need for relatively high voltages (i.e., voltages incompatible with digital electronics) for the onset of light emission has been a hindrance to the commercialization of LEDs fabricated from organic materials.

The utilization of semiconducting organic polymers (i.e., conjugated polymers) in the fabrication of LEDs expands the use of organic materials in electroluminescent devices and expands the possible applications for conducting polymers into the area of active light sources, (see Reference 7) with the possibility of significant advantages over existing LED technology. Controlling the energy gap of the polymer, either through the judicious choice of the conjugated backbone structure or through side-chain functionalization, should make possible the emission of a variety of colors throughout the visible spectrum.

In the prior art, Tomozawa et al (see Reference 8) disclosed diodes fabricated by casting semiconducting polymers from solution.

Also in the art, Burroughs et al (see Reference 7) disclosed a multi-step process in the fabrication of LED structures characterized as follows:

1) A glass substrate is utilized. The substrate is pre-coated with a transparent conducting layer of indium/tin oxide (ITO). This ITO coating, having high work function serves as the ohmic hole-injecting electrode.
2) A soluble precursor polymer to the conjugated polymer, poly(phenylene vinylene), PPV, is cast from solution onto the substrate as a thin, semitransparent layer (approximately 100–200 nm).
3) The precursor polymer is converted to the final conjugated PPV by heat treating the precursor polymer (already formed as a thin film on the substrate) to temperatures in excess of 200° C. while pumping in vacuum.
4) The negative, electron-injecting contact is fabricated from a low work function metal such as aluminum, or magnesium-silver alloy; said negative electrode acting as the rectifying contact in the diode structure. The resulting devices showed asymmetric current versus voltage curves indicative of the formation of a diode, and the diodes were observed to emit visible light under conditions of forward bias at bias voltages in excess of about 14 V with quantum efficiencies up to 0.05%.

The methods of Burroughs et al, therefore, suffer a number of specific disadvantages. Because of the use of a rigid glass substrate, the resulting LED structures are rigid and inflexible. The need for heating to temperatures in excess of 200° C. to convert the precursor polymer to the final conjugated polymer precludes the use of flexible transparent polymer substrates, such as, for example, polyethyleneterephthalate, polystyrene, polycarbonate and the like, for the fabrication of flexible LED structures with novel shapes and forms. The need for heating to temperatures in excess of 200° C. to convert the precursor polymer to the final conjugated polymer has the added disadvantage of possibly creating defects in the conjugated polymer and in particular at the upper surface of the conjugated polymer which forms the rectifying contact with the low work function metal.

Thus, the ability to fabricate light-emitting diodes from organic materials and in particular from polymers, remains seriously limited.

REFERENCES

1. P. S. Vincent, W. A. Barlow, R. A. Hann and G. G. Roberts, Thin Solid Films, 94, 476 (1982).
2. C. W. Tang, S. A. Van Syke, Appl. Phys. Lett. 51, 913 (1987).
3. C. W. Tang, S. A. Van Syke and C. H. Chen, J. Appl. Phys. 65, 3610 (1989).
4. C. Adachi, S. Tokito, T. Tsutsui, and S. Saito, Appl. Phys. Lett. 55, 1489 (1989).
5. C. Adachi, S. Tokito, T. Tsutsui, and S. Saito, Appl. Phys. Lett. 56, 799 (1989).
6. M. Nohara, M. Hasegawa, C. Hosohawa, H. Tokailin, T. Kusomoto, Chem. Lett. 189 (1990).
7. J. H. Burroughs, D. D. C. Bradley, A. R. Brown, R. N. Marks, K. Mackay, R. H. Friend, P. L. Burns and A. B. Holmes, Nature 347, 539 (1990).
8. H. Tomozawa, D. Braun, S. D. Phillips, R. Worland, A. J. Heeger, and H. Kroemer, Synth. Met. 28, C687 (1989).
9. F. Wudl, P.-M. Allemand, G. Srdanov, Z. Ni, and D. McBranch, in Materials for Non-linear optics: Chemical Perspectives (to be published in 1991).
10. S. M. Sze, Physics of Semiconductor Devices (John Wiley & Sons, New York, 1981).
11. a. T. W. Hagler, K. Pakbaz, J. Moulton, F. Wudl, P. Smith, and A. J. Heeger, Polym. Commun. (in press). b. T. W. Hagler, K. Pakbaz, K. Voss and A. J. Heeger, Phys. Rev. B. (in press).

SUMMARY OF THE INVENTION

It is accordingly an object of the present invention to overcome the aforementioned disadvantages of the prior art and, primarily, to provide light-emitting diodes fabricated from semiconducting polymers which are soluble in the conjugated form and therefore require no subsequent heat treatment at elevated temperatures.

It is additionally an object of the present invention to utilize the processing advantages associated with the fabrication of diode structures from soluble semiconductor polymers cast from solution to enable the fabrication of large active areas.

It is additionally an object of the present invention to provide light-emitting diodes fabricated from semiconducting polymers using flexible organic polymer substrates.

It is additionally an object of the present invention to provide methods for the fabrication of light-emitting diodes fabricated from semiconducting polymers which turn on at bias voltages compatible with digital electronics (i.e., at voltages less than 5 volts).

Additional objects, advantages and novel features of the invention will be set forth in part in the description which follows, and in part will become apparent to those skilled in the art on examination of the following, or may be learned by practice of the invention. The objects and advantages of the invention may be realized and attained by means of the instrumentalities and combinations particularly pointed out in the appended claims.

In one aspect this invention provides a process for fabricating light-emitting diodes (LEDs). In this embodiment the process involves a process for fabrication of light-emitting diodes which emit visible light. This process comprises the steps of:

i) precoating a substrate with a transparent conducting first layer having high work function and serving as an ohmic hole-injecting electrode;

ii) casting upon the first layer directly from solution, a thin transparent layer of a soluble conjugated polymer; and iii) fabricating a negative, electron-injecting contact onto the conjugated polymer film. This contact is formed from a low work function metal and acts as the rectifying contact in the diode structure.

In another embodiment, an alternative process for fabricating light-emitting diodes which emit visible light is provided. This process comprises the steps of:

i) casting a free-standing, semi-transparent film of a soluble conjugated polymer from solution, said film serving as a luminescent, semiconducting polymer and simultaneously as a substrate;

ii) coating the free-standing, conjugated polymer film on one side with a transparent conducting first layer having a high work function and serving as the ohmic hole-injecting electrode; and iii) fabricating a negative electron-injecting contact onto the other side of the conjugated polymer film. This contact is made of a low work function metal and acts as the rectifying contact in the diode structure.

In yet an additional embodiment this invention provides a process for making oriented polymer-based LEDs which emit polarized visible light. This process includes the steps of:

i) gel-processing a soluble conjugated polymer as a member of an admixture with ultra-high molecular weight carrier polymer. The gel-processed mixture is formed into an oriented, free-standing film in which the conjugated polymer is chain-aligned. This chain-aligning resulting in polarized luminescence for the polymer.

ii) coating the free-standing, oriented polymer film on one side with a transparent, conducting first layer having high work function and serving as an ohmic hole-injecting electrode, and iii) fabricating a negative, electron-injecting contact onto the other side of the conjugated polymer film. This contact is fabricated from a low work function metal and acts as the rectifying contact in the diode structure.

In another general aspect this invention provides the LEDs fabricated by any of these processes. In a more particular aspect of this invention, the LED devices employ poly(2-methoxy,5-(2-ethyl-hexyloxy)-1,4-phenylene vinylene), MEH-PPV, as the conjugated polymer. MEH-PPV offers the advantage of being a conjugated polymer which is soluble in organic solvents. LED device fabrication is simplified because of the direct casting of the conjugated polymer from solution.

Surprisingly, it was found that by using calcium as the low work function rectifying contact, and by using ITO coated PET films as the substrate, flexible LED structures are fabricated which benefit from the excellent mechanical properties of both the polymer substrate and the conjugated polymer semiconducting layer and which exhibit the advantageous characteristics of a turn-on voltage reduced to 3–4 volts (i.e TTL compatible), and a quantum efficiency which is improved by more than an order of magnitude to values of approximately 1%.

Specific advantages of this invention over the prior art include the following:

(i) Because the luminescent semiconducting polymer is soluble in its final conjugated form, there is no need for heat treatment at elevated temperatures. This greatly simplifies the fabrication procedure and enables a continuous manufacturing process.

(ii) Since the luminescent semiconducting polymer layer can be cast onto the substrate directly from solution at room temperature, the LED structure can be fabricated on a flexible transparent polymer substrate. These polymer films are manufactured as large area continuous films. Thus, the use of flexible polymer films as substrate enables the fabrication of large area polymer LEDs using either a batch process or a continuous process.

(iii) The use of Calcium as the low work function contact onto MEH-PPV as the luminescent polymer leads to unexpected improvements in the efficiency of the device and in the compatibility of the device with modern digital electronic circuitry.

DETAILED DESCRIPTION OF THE INVENTION

The Substrates

In some embodiments, the conjugated polymer-based LEDs are prepared on a substrate. The substrate should be transparent and nonconducting. It can be a rigid material such as a rigid plastic including rigid acrylates, carbonates, and the like, rigid inorganic oxides such as glass, quartz, sapphire, and the like. It can also be a flexible transparent organic polymer such as polyester—for example polyethyleneterephthalate, flexible polycarbonate, poly (methyl methacrylate), poly(styrene) and the like.

The thickness of this substrate is not critical.

The Conjugated Polymer

The invention provides LEDs based on conjugated polymers.

In one embodiment the conjugated polymer is cast directly from a solution onto a precooled substrate to form a substrate-supported film.

In another, the conjugated polymer is present as a free-standing film.

In a third embodiment, the conjugated polymer is present as a component of a gel-processed admixture with a carrier polymer and the film is formed from this admixture. This embodiment offers an easy way to obtain aligned conjugated polymer structures which lead to LEDs which can emit polarized light.

The conjugated polymers used herein include soluble conjugated polymers known in the art. These include, for example, poly(2-methoxy,5-(2'-ethylhexyloxy)-p-phenylenevinylene) or "MEH-PPV", P3ATs, poly(3-alkylthiophenes) (where alkyl is from 6 to 16 carbons), such as poly(2,5-dimethoxy-p-phenylene vinylene)-"PDMPV", and poly(2,5-thienylenevinylene); poly(phenylenevinylene) or "PPV" and alkoxy derivatives thereof; and polyanilines. Of these, the MEH-PPV materials are preferred. The preparation of MEH-PPV is given in the examples herein.

The conjugated polymer can be deposited or cast directly from solution. The solvent employed is one which will dissolve the polymer and not interfere with its subsequent deposition.

Typically, organic solvents are used. These can include halohydrocarbons such as methylene chloride, chloroform, and carbon tetrachloride, aromatic hydrocarbons such as xylene, benzene, toluene, other hydrocarbons such as decaline, and the like. Mixed solvents can be used, as well. Polar solvents such as water, acetone, acids and the like may be suitable. These are merely a representative exemplification and the solvent can be selected broadly from materials meeting the criteria set forth above.

When depositing the conjugated polymer on a substrate, the solution can be relatively dilute, such as from 0.1 to 20% w in concentration, especially 0.2 to 5% w. Film thicknesses of 50–400 and 100–200 nm are used.

The Carrier Polymer

In some embodiments, the conjugated polymer is present in admixture with a carrier polymer.

The criteria for the selection of the carrier polymer are as follows. The material should allow for the formation of mechanically coherent films, at low concentrations, and remain stable in solvents that are capable of dispersing, or dissolving the conjugated polymers for forming the final film. Low concentrations of carrier polymer are preferred in order to minimize processing difficulties, i.e., excessively high viscosity or the formation of gross inhomogeneities; however the concentration of the carrier should be high enough to allow for formation of coherent structures. Preferred carrier polymers are high molecular weight (M.W.>100,000) flexible chain polymers, such as polyethylene, isotactic polypropylene, polyethylene oxide, polystyrene, and the like. Under appropriate conditions, which can be readily determined by those skilled in the art, these macromolecular materials enable the formation of coherent structures from a wide variety of liquids, including water, acids, and numerous polar and nonpolar organic solvents. Films or sheets manufactured using these carrier polymers have sufficient mechanical strength at polymer concentrations as low as 1%, even as low as 0.1%, by volume to enable the coating and subsequent processing as desired.

Mechanically coherent films can also be prepared from lower molecular weight flexible chain polymers, but generally, higher concentrations of these carrier polymers are required.

Selection of the carrier polymer is made primarily on the basis of compatibility of the conjugated polymer, as well as with the solvent or solvents used. For example, blending of polar conducting polymers generally requires carrier structures that are capable of co-dissolving with or absorbing polar reactants. Examples of such coherent structures are those comprised of poly(vinyl alcohol), poly(ethylene oxide), poly-para(phenylene terephthalate), poly-para-benzamide, etc., and suitable liquids. On the other hand, if the blending of the final polymer cannot proceed in a polar environment, nonpolar carrier structures are selected, such as those containing polyethylene, polypropylene, poly (butadiene), and the like.

Turning now to the issue of concentration, it is of crucial importance that the carrier structure formed have sufficient mechanical coherence for further handling during the formation of the final polymer blend. Therefore, the initial concentration of the carrier polymer generally is selected above 0.1% by volume, and more preferably above about 0.75% by volume. On the other hand, it is not desirable to select carrier polymer concentrations exceeding 90% by volume, because this has a diluting effect on the final conjugated polymer composite product. More preferably, the concentration of the carrier polymer in the solution is below 50% by volume, and still more preferably below 25% by volume.

Thus, solution is provided by dissolving a selected carrier polymer and conjugated polymer in a compatible solvent (or mixed solvents) to a predetermined concentration (using the aforementioned guidelines). In the present process the "compatible solvent" is a solvent system into which a desired quantity of soluble conjugated polymer (or soluble precursor polymer) can be dissolved. The solvent system is also one in which the carrier polymer is substantially soluble, and will not interfere with the subsequent structure formation process. The carrier solution is formed into selected shape, e.g. a fiber, film or the like, by extrusion or by any other suitable method. The solvent is then removed (through evaporation, extraction, or any other convenient method).

Gels can be formed from the carrier conjugate solution in various ways, e.g., through chemical crosslinking of the macromolecules in solution, swelling of cross-linked macromolecules, thermoreversible gelation, and coagulation of polymer solutions. In the present invention, the two latter types of gel formation are preferred, although under certain experimental conditions, chemically crosslinked gels may be preferred.

Thermoreversible gelation refers to the physical transformation of polymer solution to polymer gel upon lower of the temperature of a homogeneous polymer solution (although in exceptional cases a temperature elevation may be required). This mode of polymer gelation requires the preparation of a homogeneous solution of the selected carrier polymer in an appropriate solvent according to standard techniques known to those skilled in the art. The polymer solution is cast or extruded into a fiber, rod or film form, and the temperature is lowered to below the gelation temperature of the polymer in order to form coherent gels. This procedure is well known and is commercially employed, e.g., for the formation of gels of high molecular weight polyethylene in decalin, paraffin oil, oligomeric polyolefins, xylene, etc., as precursors for high strength polyolefin fibers and films.

"Coagulation" of a polymer solution involves contacting the solution with a nonsolvent for the dissolved polymer, thus causing the polymer to precipitate. This process is well known, and is commercially employed, for example, in the formation of rayon fibers and films, and spinning of high-performance aramid fibers, etc.

Frequently, it is desirable to subject the carrier polymer/conducting polymer composite to mechanical deformation, typically by stretching, during or after the initial forming step. Deformation of polymeric materials is carried out in order to orient the macromolecules in the direction of draw, which results in improved mechanical properties. Maximum deformations of thermoreversible gels are substantially greater than melt processed materials. (P. Smith and P. J. Lemstra, Colloid and Polym. Sci., 258, 891, (1980).) The large draw ratios possible with thermoreversible gels are also advantageous if composite materials may be prepared with materials limited in their drawability due to low molecular weights. In the case of conducting polymers, not only do the mechanical properties improve, but, more importantly, the electrical conductivity also often displays drastic enhancement by tensile drawing and the orientation of the conjugated polymer gives rise to LEDs which will emit polarized light because of the orientation.

The Transparent Conducting First Layer

The conjugated polymer layer of the LEDs of this invention is bounded on one surface by a transparent conducting first layer.

When a substrate is present, this layer is between the substrate and the conjugated polymer layer. This first layer is a transparent conductive layer made of a high work function material that is a material with a work function above 4.5 eV. This layer can be a film of an electronegative metal such as gold or silver, with gold being the preferred member of that group. It can also be formed of a conductive metal-metal oxide mixture such as indium-tin oxide.

These layers are commonly deposited by vacuum sputtering (RF or Magnetron) electron beam evaporation, thermal vapor deposition, chemical deposition and the like.

The ohmic contact layer should be low resistance: preferably less than 300 ohms/square and more preferably less than 100 ohms/square.

The Electron Injecting Contact

On the other side of the conjugated polymer film an electron-injecting contact is present. This is fabricated from a low work function metal or alloy (a low work function material has a work function below 4.3. Typical materials include indium, calcium, barium and magnesium, with calcium being a particularly good material. These electrodes are applied by using methods well-known to the art (e.g. evaporated, sputtered, or electron-beam evaporation) and acting as the rectifying contact in the diode structure.

EXAMPLES

This invention will be further described by the following examples. These are intended to embody the invention but not to limit its scope.

Example 1

This example involves the preparation of poly(2-methoxy, 5-(2'-ethylhexyloxy)-p-phenylenevinylene) "MEH-PPV".

Monomer Synthesis

1. Preparation of 1-Methoxy-4-(2-Ethyl-Hexyloxy) Benzene

A solution of 24.8 g (0.2 mole) of 4-methoxy phenol in 150 ml dry methanol was mixed under nitrogen with 2.5M solution of sodium methoxide (1.1 equivalent) and refluxed for 20 min. After cooling the reaction mixture to room temperature, a solution of 2-ethylbromohexane (42.5 ml, 1.1 equivalent) in 150 ml methanol was added dropwise. After refluxing for 16 h, the brownish solution turned light yellow. The methanol was evaporated and the remaining mixture of the white solid and yellow oil was combined with 200 ml of ether, washed several times with 10% aqueous sodium hydroxide, $H_2O$ and dried over $MgSO_4$. After the solvent was evaporated, 40 g (85%) of yellow oil was obtained. The crude material was distilled under vacuum (2.2 mm Hg, b.p. 148°–149° C.), to give a clear, viscous liquid. $^1$H NMR ($CDCl_3$) δ 6.98 (4H, s, aromatics), 3.8 (5H, t, O—$CH_2$, O—$CH_3$), 0.7–1.7 (15 H, m, $C_7H_{15}$. IR (NaCl plate) 750, 790, 825, 925, 1045, 1105, 1180, 1235, 1290, 1385, 1445, 1470, 1510, 1595, 1615, 1850, 2030, 2870, 2920, 2960, 3040. MS. Anal. Calc. for $C_{15}H_{24}O_2$: C, 76.23; H, 10.23; O, 13.54. Found: C, 76.38; H, 10.21; O, 13.45.

2. Preparation of 2,5-bis(Chloromethyl)-1-Methoxy-4-(2-Ethyl-Hexyloxy)Benzene

To the solution of 4.9 g (20.7 mmoles) of compound (1) in 100 ml p-dioxane cooled down to 0°–5° C., 18 ml of conc. HCl, and 10 ml of 37% aqueous formalin solution was added. Anhydrous HCl was bubbled for 30 min, the reaction mixture warmed up to R.T. and stirred for 1.5–2 h. Another 10 ml of formalin solution was added and HCl gas bubbled for 5–10 min at 0°–5° C. After stirring at R.T. for 16 h, and then refluxed for 3–4 h. After cooling and removing the solvents, an off-white "greasy" solid was obtained. The material was dissolved in a minimum amount of hexane and precipitated by adding methanol until the solution became cloudy. After cooling, filtering and washing with cold methanol, 3.4 g (52%) of white crystalline material (mp 52°–54° C.) was obtained. $^1$H NMR ($CDCl_3$) δ 6.98 (2H, s, aromatics), 4.65 (4H, s, $CH_2$—Cl), 3.86 (5H, t, O—$CH_3$, O—$CH_2$), 0.9–1.5 (15H, m, $C_7H_{15}$), IR (KBr) 610, 700, 740, 875, 915, 1045, 1140, 1185, 1230, 1265, 1320, 1420, 1470, 1520, 1620, 1730, 2880, 2930, 2960, 3050. MS. Anal. Calc. for $C_{17}H_{26}O_2Cl_2$: C, 61.26; H, 7.86; O, 9.60; Cl, 21.27. Found: C, 61.31; h, 7.74; O, 9.72; Cl, 21.39.

Polymerization

Preparation of Poly(1-Methoxy-4-(2-Ethylhexyloxy-2,5-Phenylenevinylene) MEH-MPV

To a solution of 1.0 g (3 mmol) of 2,5-bis(chloromethyl)-methoxy-4-(2-ethylhexyloxy)benzene in 20 ml of anhydrous THF was added dropwise a solution of 2.12 g (18 mmol) of 95% potassium tert-butoxide in 80 ml of anhydrous THF at R.T. with stirring. The reaction mixture was stirred at ambient temperature for 24 h and poured into 500 ml of methanol with stirring. The resulting red precipitate was washed with distilled water and reprecipitated from THF/methanol and dried under vacuum to afford 0.35 g (45% yield). UV ($CHCl_3$) 500. IR (film) 695, 850, 960, 1035, 1200, 1250, 1350, 1410, 1460, 1500, 2840, 2900, 2940, 3040. Anal. Calc. for $C_{17}H_{24}O_2$: C, 78.46; H, 9.23. Found: C, 78.34; H, 9.26.

Molecular weight (GPC vs. polystyrene) $3\times10^5$. Inherent viscosity~5 dl/g (but time dependent due to the tendency to form aggregates). As is the case with a few other stiff chain polymers, the viscosity increases with standing, particularly in benzene. The resulting solution is therefore thixotropic.

The conjugated polymer is highly colored (bright red-orange).

Example 2

Preparation of MEH-PPV via a precursor polymer route.

Monomer Synthesis

The monomer synthesis is exactly the same as in Example 1.

Polymerization of the Precursor Polymer and Conversion to MEH-PPV

A solution of 200 mg (0.39 mmol) of the monomer salt of Example 1 in 1.2 ml dry methanol was cooled to 0° C. for 10 min and a cold degassed solution of 28 mg (1.7 equivalents) of sodium hydroxide in 0.7 ml methanol was added slowly. After 10 min the reaction mixture became yellow and viscous. The above mixture was maintained at 0° C. for another 2–3 h and then the solution was neutralized. A very thick, gum-like material was transferred into a Spectrapore membrane (MW cutoff 12,000–14,000) and dialyzed in degassed methanol containing 1% water for 3 days. After drying in vacuo, 70 mg (47%) of "plastic" yellow precursor polymer material was obtained. UV (CHCl$_3$) 365. IR (film) 740, 805, 870, 1045, 1075, 1100, 1125, 1210, 1270, 1420, 1470, 1510, 2930, 2970, 3020. Soluble in C$_6$H$_5$Cl, C$_6$H$_3$Cl$_3$, CH$_2$Cl$_2$, CHCl$_3$, Et$_2$O, THF. Insoluble in MeOH.

The precursor polymer was converted to the conjugated MEH-PPV by heating to reflux (approx. 214° C.) in 1,2,4-trichlorobenrzene solvent. The product was identical with the material obtained in Example 1.

Example 3

Light-emitting diodes (LEDs) were fabricated consisting of a rectifying indium (work function=4.2 eV, Reference 10) contact on the front surface of an MEH-PPV film which is deposited by spin-casting from dilute tetrahydrofuran solution containing 1% MEH-PPV by weight onto a glass substrate. The resulting MEH-PPV films have uniform surfaces with thicknesses near 1200 Å. The glass substrate had been previously coated with a layer of indium/tin-oxide to form an ohmic contact. The Indium contact is deposited on top of the MEH-PPV polymer film by vacuum evaporation at pressures below $4\times10^{-7}$ Torr yielding active areas of 0.04 cm$^2$.

While ramping the applied bias, yellow-orange light becomes visible to the eye just below 9 V forward bias (no light is observed under reversed bias). Above 15 V, the rectification ratio of the diode exceeds $10^4$.

The EL spectra, obtained with 3 V AC superposed (at 681 Hz) on 13 V forward bias, showed characteristic spectral features similar to those observed in the photoluminescence of MEH-PPV.[11] The room temperature electroluminescence peaks near 2.1 eV with a hint of a second peak above 1.9 eV. At 90K, the intensity increases and shifts to the red, and the two peaks become clearly resolved.

The electroluminecence intensity was measured as a function of current flow under increasing forward bias. The quantum efficiency was determined with a calibrated Silicon photodiode and corrected for the spectral response and the solid angle of the collecting optics. The measured quantum efficiency at 0.8 mA is $\approx 5\times10^{-4}$ photons per electron for Indium electrodes.

Example 4

Light-emitting diodes (LEDs) were fabricated consisting of a rectifying calcium (work function=3 eV, Reference 10) contact on the front surface of an MEH-PPV film which is deposited by spin-casting from dilute solution onto a glass substrate. The resulting MEH-PPV films have uniform surfaces with thicknesses near 1200 Å. The glass substrate has been partially coated with a layer of indium/tin-oxide to form an "ohmic" contact. The calcium contact is deposited on top of the MEH-PPV polymer film by vacuum evaporation at pressures below $4\times10^{-7}$ Torr yielding active areas of 0.04 cm$^2$.

For the calcium/MEH-PPV diodes, rectification ratios as high as $10^5$ are achieved.

While ramping the applied bias, yellow-orange light becomes visible to the eye just above 3 V forward bias (no light is observed under reversed bias). The quantum efficiency was determined with a calibrated Silicon photodiode and corrected for the spectral response and the solid angle of the collecting optics. The measured quantum efficiency at 0.8 mA is $\approx 7\times10^{-3}$ photons per electron for calcium electrodes (i.e., nearly 1%!!). The emission from the Calcium/MEH-PPV LEDs is bright and easily seen in a lighted room at 4 V forward bias.

Example 5

Light-emitting diodes (LEDs) were fabricated consisting of a rectifying calcium (work function=3 eV, Reference 10) contact on the front surface of an MEH-PPV film which is deposited by spin-casting from dilute solution onto a flexible transparent polyethyleneterephthalate (PET) film (7 mils thickness) as substrate. The resulting MEH-PPV films on PET have uniform surfaces with thicknesses near 1200 Å. The PET substrate is pre-coated with a layer of indium/tin-oxide to form an "ohmic" contact. The calcium rectifying contact is deposited on top of the MEH-PPV polymer film by vacuum evaporation at pressures below $4\times10^{-7}$ Torr yielding active areas of 0.04 cm$^2$.

For the calcium/MEH-PPV-ITO/PET diodes, rectification ratios as high as $10^3$ are achieved.

While ramping the applied bias, yellow-orange light becomes visible to the eye just above 3 V forward bias (no light is observed under reversed bias). The quantum efficiency was determined with a calibrated Silicon photodiode and corrected for the spectral response and the solid angle of the collecting optics. The measured quantum efficiency at 5.5 μA is $4\times10^{-3}$ photons per electron for calcium electrodes. The emission from the calcium/MEH-PPV LEDs is bright and easily seen in a lighted room at 4 V forward bias.

Example 6

MEH-PPV is cast onto a film of pure UHMW-PE which has been stretched to a moderate draw ratio (e.g. draw ratio >20, Reference 11). The MEH-PPV is observed to orient spontaneously along the draw direction; both the photo-absorption and the photoluminescence spectra are highly anisotropic. Since the luminescence spectrum is polarized with electric vector along the chain alignment direction, light-emitting diodes can be fabricated which emit polarized light.

Example 7

MEH-PPV was gel-processed and chain oriented as a guest in UHMW-PE. The gel-processing of a conjugated polymer as a guest in a gel-processed blend involves three steps:

A. Co-solution with a suitable carrier polymer
B. Carrier Structure Formation
C. Drawing of the Carrier/Polymer blend.

Carrier Solution Preparation, Film Formation, Gelation, and Drawing.

PE-MEH-PPV blends are prepared by mixing MEH-PPV ($M_w$=450,000) in xylene with UHMW polyethylene (Hostalen GUR 415; $M_w$=$4\times10^6$) in xylene such that the PE to solvent ratio was 0.75% by weight. This solution is thoroughly mixed and allowed to equilibrate in a hot oil bath at 126° C. for one hour. The solution is then poured onto a glass surface to cool, forming a gel which was allowed to dry (into a film). Films were then cut into strips and tensile-drawn over a hot pin at 110°–120° C. Once processed in this manner, the films are oriented. The high work function and low work function electrodes are offered as in Examples 4 and 5, and LEDs result.

We claim:

1. A process for fabrication of a light-emitting diode which emits visible light and which turns on at voltages below 5 volts, which process comprises the steps of:
   i) precoating a substrate with a transparent conducting first layer, said first layer having high work function and serving as a hole-injecting electrode;
   ii) casting upon said first layer directly from solution, a transparent layer of a soluble semiconducting luminescent conjugated polymer; and
   iii) fabricating onto the semiconducting conjugated polymer layer from a low work function metal, an electron-injecting contact.

2. The process of claim 1, wherein the substrate is a transparent, inorganic substrate.

3. The process of claim 1, wherein the substrate is a transparent, organic polymer substrate.

4. The process of claim 1, wherein the conducting first layer is an electronegative metal.

5. The process of claim 1, wherein the conducting first layer is a conductive metal-metal oxide mixture.

6. The process of claim 1, wherein the semiconducting conjugated polymer film comprises poly(2-methoxy,5-(2'-ethylhexyloxy)-1,4-phenylenevinylene).

7. The process of claim 1, wherein the low work function metal is calcium.

8. The process of claim 1, wherein the semiconducting conjugated polymer film comprises a semiconducting conjugated polymer selected from the group consisting of poly(phenylenevinylene) and alkoxy derivatives thereof.

9. The process of claim 1, wherein the conducting first layer comprises gold or silver.

10. The process of claim 1, wherein the conducting first layer comprises indium-tin oxide.

11. The process of claim 1, wherein the substrate comprises an organic polymer selected from the group consisting of polyesters, polycarbonates, polyacrylates, and polystyrenes.

12. The process of claim 1, wherein the low work function metal is barium.

13. A process for fabrication of a light-emitting diode which emits visible light and which turns on at voltages below 5 volts, which process comprises the steps of:
   i) precoating a substrate with a transparent conducting first layer, said first layer having high work function and serving as a hole-injecting electrode;
   ii) casting upon said first layer directly from solution, a transparent layer of a soluble semiconducting luminescent conjugated polymer; and
   iii) fabricating onto the semiconducting conjugated polymer layer from calcium or a lower work function alkaline earth metal, an electron-injecting contact.

14. The process of claim 13, wherein the substrate is a transparent, inorganic substrate.

15. The process of claim 13, wherein the substrate is a transparent, organic polymer substrate.

16. The process of claim 13, wherein the substrate comprises an organic polymer selected from the group consisting of polyesters, polycarbonates, polyacrylates, and polystyrenes.

17. The process of claim 13, wherein the conducting first layer is a conductive metal-metal oxide mixture.

18. The process of claim 13, wherein the conducting first layer comprises indium-tin oxide.

19. The process of claim 13, wherein the conducting first layer is an electronegative metal.

20. The process of claim 13, wherein the conducting first layer comprises gold or silver.

21. The process of claim 13, wherein the semiconducting conjugated polymer film comprises a semiconducting conjugated polymer selected from the group consisting of poly(phenylenevinylene) and alkoxy derivatives thereof.

22. The process of claim 13, wherein the semiconducting conjugated polymer film comprises poly(2-methoxy,5-(2'-ethylhexyloxy)-1,4-phenylenevinylene).

23. The process of claim 13, wherein electron-injecting contact is calcium.

24. The process of claim 13, wherein electron-injecting contact is barium.

25. A process for fabrication of a light-emitting diode which emits visible light and which turns on at voltages below 5 volts, which process comprises the steps of:
   i) precoating a substrate with a transparent conducting first layer, said first layer having high work function and serving as a hole-injecting electrode;
   ii) casting upon said first layer directly from solution, a transparent layer of a soluble semiconducting luminescent conjugated polymer; and
   iii) fabricating onto the semiconducting conjugated polymer layer from calcium, an electron-injecting contact.

26. The process of claim 25, wherein the substrate is a transparent, inorganic substrate.

27. The process of claim 25, wherein the substrate is a transparent, organic polymer substrate.

28. The process of claim 25, wherein the substrate comprises an organic polymer selected from the group consisting of polyesters, polycarbonates, polyacrylates, and polystyrenes.

29. The process of claim 25, wherein the conducting first layer is a conductive metal-metal oxide mixture.

30. The process of claim 25, wherein the conducting first layer comprises indium-tin oxide.

31. The process of claim 25, wherein the conducting first layer is an electronegative metal.

32. The process of claim 25, wherein the conducting first layer comprises gold or silver.

33. The process of claim 25, wherein the semiconducting conjugated polymer film comprises a semiconducting conjugated polymer selected from the group consisting of poly(phenylenevinylene) and alkoxy derivatives thereof.

34. The process of claim 25, wherein the semiconducting conjugated polymer film comprises poly(2-methoxy,5-(2'-ethylhexyloxy)-1,4-phenylenevinylene).

35. A process for fabrication of a light-emitting diode which emits visible light and which turns on at voltages below 5 volts, which process comprises the steps of:
   i) precoating a substrate with a transparent conducting first layer, said first layer having high work function and serving as a hole-injecting electrode;
   ii) casting upon said first layer directly from solution, a transparent layer of a soluble semiconducting luminescent conjugated polymer; and
   iii) fabricating onto the semiconducting conjugated polymer layer from barium, an electron-injecting contact.

36. The process of claim 35, wherein the substrate is a transparent, inorganic substrate.

37. The process of claim 35, wherein the substrate is a transparent, organic polymer substrate.

38. The process of claim 35, wherein the substrate comprises an organic polymer selected from the group consisting of polyesters, polycarbonates, polyacrylates, and polystyrenes.

39. The process of claim 35, wherein the conducting first layer is a conductive metal-metal oxide mixture.

40. The process of claim 35, wherein the conducting first layer comprises indium-tin oxide.

41. The process of claim 35, wherein the conducting first layer is an electronegative metal.

42. The process of claim 35, wherein the conducting first layer comprises gold or silver.

43. The process of claim 35, wherein the semiconducting conjugated polymer film comprises a semiconducting conjugated polymer selected from the group consisting of poly(phenylenevinylene) and alkoxy derivatives thereof.

44. The process of claim 35, wherein the semiconducting conjugated polymer film comprises poly(2-methoxy,5-(2'-ethylhexyloxy)-1,4-phenylenevinylene).

45. A process for fabrication of a light-emitting diode which emits visible light and which turns on at voltages below 5 volts, which process comprises the steps of:
  i) precoating a substrate with a transparent conducting first layer, said first layer having high work function and serving as a hole-injecting electrode;
  ii) casting upon said first layer directly from solution, a transparent layer of a soluble semiconducting luminescent conjugated polymer selected from the group of poly(phenylenevinylene) and alkoxy derivatives thereof; and
  iii) fabricating onto the semiconducting conjugated polymer layer from calcium or a lower work function alkaline earth metal, an electron-injecting contact.

46. The process of claim 45, wherein the substrate is a transparent, inorganic substrate.

47. The process of claim 45, wherein the substrate is a transparent, organic polymer substrate.

48. The process of claim 45, wherein the substrate comprises an organic polymer selected from the group consisting of polyesters, polycarbonates, polyacrylates, and polystyrenes.

49. The process of claim 45, wherein the conducting first layer is a conductive metal-metal oxide mixture.

50. The process of claim 45, wherein the conducting first layer comprises indium-tin oxide.

51. The process of claim 45, wherein the conducting first layer is an electronegative metal.

52. The process of claim 45, wherein the conducting first layer comprises gold or silver.

53. The process of claim 45, wherein the semiconducting conjugated polymer film comprises poly(2-methoxy,5-(2'-ethylhexyloxy)-1,4-phenyenevinylene).

54. The process of claim 45, wherein the electron-injecting contact is calcium.

55. The process of claim 45, wherein the electron-injecting contact is barium.

56. A process for fabrication of a light-emitting diode which emits visible light and which turns on at voltages below 5 volts, which process comprises the steps of:
  i) precoating a substrate with a transparent conducting first layer, said first layer having high work function and serving as a hole-injecting electrode;
  ii) casting upon said first layer directly from solution, a transparent layer of a soluble semiconducting luminescent conjugated polymer selected from the group of poly(phenylenevinylene) and alkoxy derivatives thereof; and
  iii) fabricating onto the semiconducting conjugated polymer layer from calcium, an electron-injecting contact.

57. The process of claim 56, wherein the substrate is a transparent, inorganic substrate.

58. The process of claim 56, wherein the substrate is a transparent, organic polymer substrate.

59. The process of claim 56, wherein the substrate comprises an organic polymer selected from the group consisting of polyesters, polycarbonates, polyacrylates, and polystyrenes.

60. The process of claim 56, wherein the conducting first layer is a conductive metal-metal oxide mixture.

61. The process of claim 56, wherein the conducting first layer comprises indium-tin oxide.

62. The process of claim 56, wherein the conducting first layer is an electronegative metal.

63. The process of claim 56, wherein the conducting first layer comprises gold or silver.

64. The process of claim 56, wherein the semiconducting conjugated polymer film comprises poly(2-methoxy,5-(2'-ethylhexyloxy)-1,4-phenylenevinylene).

65. A process for fabrication of a light-emitting diode which emits visible light and which turns on at voltages below 5 volts, which process comprises the steps of:
  i) precoating a substrate with a transparent conducting first layer, said first layer having high work function and serving as a hole-injecting electrode;
  ii) casting upon said first layer directly from solution, a transparent layer of a soluble semiconducting luminescent conjugated polymer selected from the group of poly(phenylenevinylene) and alkoxy derivatives thereof; and
  iii) fabricating onto the semiconducting conjugated polymer layer from barium, an electron-injecting contact.

66. The process of claim 65, wherein the substrate is a transparent, inorganic substrate.

67. The process of claim 65, wherein the substrate is a transparent, organic polymer substrate.

68. The process of claim 65, wherein the substrate comprises an organic polymer selected from the group consisting of polyesters, polycarbonates, polyacrylates, and polystyrenes.

69. The process of claim 65, wherein the conducting first layer is a conductive metal-metal oxide mixture.

70. The process of claim 65, wherein the conducting first layer comprises indium-tin oxide.

71. The process of claim 65, wherein the conducting first layer is an electronegative metal.

72. The process of claim 65, wherein the conducting first layer comprises gold or silver.

73. The process of claim 65, wherein the semiconducting conjugated polymer film comprises poly(2-methoxy,5-(2'-ethylhexyloxy)-1,4-phenylenevinylene).

* * * * *